(12) United States Patent
Reid et al.

(10) Patent No.: US 8,964,801 B2
(45) Date of Patent: *Feb. 24, 2015

(54) METHOD AND SYSTEM FOR STABLE AND TUNABLE HIGH POWER PULSED LASER SYSTEM

(75) Inventors: Benoit Reid, Laval (CA); Tullio Panarello, St-Lazare (CA); Stephane Caplette, L'lle-Bizard (CA)

(73) Assignee: ESI-Pyrophotonics Lasers, Inc., Quebec (CA)

( * ) Notice: Subject to any disclaimer, the term of this patent is extended or adjusted under 35 U.S.C. 154(b) by 0 days.

This patent is subject to a terminal disclaimer.

(21) Appl. No.: 12/796,193

(22) Filed: Jun. 8, 2010

(65) Prior Publication Data
US 2011/0142084 A1 Jun. 16, 2011

Related U.S. Application Data

(60) Provisional application No. 61/186,317, filed on Jun. 11, 2009.

(51) Int. Cl.
*H01S 3/10* (2006.01)
*H01S 5/40* (2006.01)
*H01S 3/067* (2006.01)
(Continued)

(52) U.S. Cl.
CPC ........... *H01S 5/4006* (2013.01); *H01S 3/06754* (2013.01); *H01S 5/06216* (2013.01); *H01S 5/146* (2013.01)
USPC .............................................. 372/20; 372/6

(58) Field of Classification Search
USPC ..................................................... 372/6, 20
See application file for complete search history.

(56) References Cited

U.S. PATENT DOCUMENTS

| 3,806,829 | A | 4/1974 | Duston et al. |
| 5,054,876 | A | 10/1991 | Grasso et al. |
| 5,136,600 | A | 8/1992 | Fidric et al. |

(Continued)

FOREIGN PATENT DOCUMENTS

| CN | 101427430 A | 5/2009 |
| JP | 05-152654 A | 6/1993 |

(Continued)

OTHER PUBLICATIONS

Di Teodoro et al., "High-Power Pulsed Fibre Source at 1567 nm," Electronics Letters, Nov. 25, 2004, vol. 40, Issue 24, pp. 1525-1526.
(Continued)

*Primary Examiner* — Yuanda Zhang
(74) *Attorney, Agent, or Firm* — Haynes Beffel & Wolfeld LLP

(57) ABSTRACT

A laser system includes an injection laser source having an output and operable to provide a laser output characterized by a first wavelength, a first linewidth, an output power. The laser system also includes a tunable pulsed source characterized by a gain bandwidth. The tunable pulsed source is operable to provide an output signal having an average power. The output signal includes a plurality of optical pulses. Each of the plurality of optical pulses is characterized by a second wavelength, a second linewidth, and a peak power. The laser system further includes an optical combiner having a first port coupled to the output of the injection laser source, a second port coupled to the tunable pulsed source, and a third port.

20 Claims, 14 Drawing Sheets

(51) Int. Cl.
   *H01S 5/062* (2006.01)
   *H01S 5/14* (2006.01)

(56) References Cited

U.S. PATENT DOCUMENTS

| | | | |
|---|---|---|---|
| 5,400,350 | A | 3/1995 | Galvanauskas |
| 5,524,012 | A * | 6/1996 | Wang et al. ............... 372/23 |
| 5,745,284 | A | 4/1998 | Goldberg et al. |
| 5,886,808 | A | 3/1999 | Skeldon et al. |
| 6,148,011 | A | 11/2000 | Larose et al. |
| 6,317,255 | B1 | 11/2001 | Fatehi et al. |
| 6,342,965 | B1 | 1/2002 | Kinoshita |
| 6,462,862 | B2 | 10/2002 | Kinoshita |
| 6,661,947 | B2 | 12/2003 | Shirai |
| 6,747,788 | B2 | 6/2004 | Kinoshita |
| 6,826,209 | B1 | 11/2004 | Morita et al. |
| 6,885,683 | B1 | 4/2005 | Fermann et al. |
| 6,975,447 | B2 | 12/2005 | Kinoshita |
| 7,256,930 | B2 | 8/2007 | Liu |
| 7,428,253 | B2 | 9/2008 | Murison et al. |
| 7,443,893 | B2 | 10/2008 | Murison et al. |
| 7,667,889 | B2 | 2/2010 | Murison et al. |
| 2002/0044324 | A1 | 4/2002 | Hoshida et al. |
| 2002/0126952 | A1 | 9/2002 | Shirai |
| 2002/0146046 | A1* | 10/2002 | Kim et al. ............... 372/20 |
| 2002/0186739 | A1 | 12/2002 | Sandstrom et al. |
| 2003/0103534 | A1* | 6/2003 | Braiman et al. ............... 372/10 |
| 2004/0257643 | A1 | 12/2004 | Chen |
| 2005/0018724 | A1* | 1/2005 | Da Silva et al. ............... 372/32 |
| 2005/0088724 | A1 | 4/2005 | Lee et al. |
| 2006/0198406 | A1* | 9/2006 | Seeds ............... 372/32 |
| 2007/0268942 | A1* | 11/2007 | Murison et al. ............... 372/25 |
| 2008/0080570 | A1* | 4/2008 | Murison et al. ............... 372/20 |
| 2008/0089369 | A1* | 4/2008 | Luo et al. ............... 372/28 |
| 2009/0074019 | A1 | 3/2009 | Wong et al. |
| 2009/0086773 | A1* | 4/2009 | Murison et al. ............... 372/20 |
| 2009/0296759 | A1* | 12/2009 | Starodoumov ............... 372/25 |
| 2009/0310627 | A1* | 12/2009 | Chen et al. ............... 372/6 |

FOREIGN PATENT DOCUMENTS

| | | |
|---|---|---|
| JP | 2001-036169 A | 2/2001 |
| JP | 2001077464 A | 3/2001 |
| JP | 2005128229 A | 5/2005 |
| WO | WO 03/039044 A2 | 5/2003 |
| WO | WO 2004/107510 A2 | 12/2004 |
| WO | WO 2007/140033 A2 | 12/2007 |
| WO | WO 2008/037087 A1 | 4/2008 |

OTHER PUBLICATIONS

Skeldon et al., "A High-Bandwidth Electrical-Waveform Generator Based on Aperture-Coupled Striplines for OMEGA Pulse-Shaping Applications," CLEO 98. Technical Digest. Summaries of papers presented at the Conference on Lasers and Electro-Optics, 1998., May 3-8, 1998, pp. 345-356.

Matsui et al., "Generation of wavelength tunable gain-switched pulses from FP MQW lasers with external injection seeding", IEEE Photonics Technology Letters, Aug. 1997; 9(8):1087-1089.

Zhang et al., "Tunable dual-wavelength picosecond pulse generation by the use of two Fabry-Perot laser diodes in an external injection seeding scheme", Technology Letters, Jan. 2002; 14(1):92-94.

International Search Report and Written Opinion of PCT Application No. PCT/CA2010/000899, mailed Sep. 29, 2010, 9 pages total.

Notice of Reasons of Rejection in related JP Application No. 2012-514308 dated Feb. 12, 2014, 7 pages.

Non-certified translation of CN Search Report in related case CN 201080031302.5 dated Aug. 21, 2014, 11 pages.

Non-certified translation of CN Search Report in related case CN 201080031302.5 dated Mar. 4, 2013, 12 pages.

CN Office Action in related case CN 201080031302.5 dated Nov. 15, 2014, 11 pages (non-certified English translation).

Lan, Xinju et al., "Laser Technology," Science Press, Second Ed., Jan. 2005, pp. 5-34, 201-205.

Zhou, Bingkun et al., "Laser Theory," National Defence Industry Press, Fifth Ed., Aug. 2004, pp. 228-233.

* cited by examiner

METHOD AND SYSTEM FOR STABLE AND TUNABLE HIGH POWER PULSED LASER SYSTEM

CROSS-REFERENCES TO RELATED APPLICATIONS

This application claims priority to U.S. Provisional Patent Application No. 61/186,317, filed on Jun. 11, 2009, entitled "Stable Tunable High Power Pulsed Laser Source," the disclosure of which is hereby incorporated by reference in its entirety for all purposes.

BACKGROUND OF THE INVENTION

Pulsed laser sources, such as Nd:YAG lasers, have been used to perform laser-based material processing for applications such as marking, engraving, micro-machining, and cutting. Many existing high power pulsed lasers that are characterized by pulse energies greater than 0.5 mJ per pulse, rely on techniques such as Q-switching and mode locking to generate optical pulses. However, such lasers produce optical pulses with characteristics that are predetermined by the cavity geometry, the mirror reflectivities, and the like. As such, the characteristics of such laser pulses cannot generally be varied in the field without compromising the laser performance. Using such lasers, it is generally difficult to achieve a range of variable pulse characteristics.

Pulsed laser sources such as diode lasers can be pulsed in a simple manner by providing a pulsed electronic drive signal. However, the center wavelength of the signal from such a pulsed laser source may change and the signal linewidth may also be broadened as the electronic drive signal is applied, which may be strongly dependent upon the current level of the drive signal. One undesirable result of such broadened linewidth is to significantly reduce the efficiency of the harmonics generation using frequency doubling, tripling, and the like. Thus, there is a need in the art for developing stable pulsed laser sources with tunable pulse characteristics.

SUMMARY OF THE INVENTION

According to the present invention, methods and systems related to the field of tunable laser sources are provided. More particularly, the present invention relates to a method and apparatus for providing high power pulsed laser sources useful for industrial applications such as trimming, marking, cutting, and welding. Merely by way of example, the invention has been applied to a laser source with real-time tunable characteristics including pulse width, peak power, repetition rate, temporal pulse shape, polarization, wavelength, and/or spectral linewidth. However, the present invention has broader applicability and can be applied to other laser sources.

According to an embodiment of the present invention, a laser system includes an injection laser source having an output and operable to provide a laser output characterized by a first wavelength, a first linewidth, an output power. The laser system also includes a tunable pulsed source characterized by a gain bandwidth. The tunable pulsed source is operable to provide an output signal having an average power. The output signal includes a plurality of optical pulses. Each of the plurality of optical pulses is characterized by a second wavelength, a second linewidth, and a peak power. The laser system further includes an optical combiner having a first port coupled to the output of the injection laser source, a second port coupled to the tunable pulsed source, and a third port.

According to another embodiment of the present invention, a method for providing a plurality of signal pulses is provided. The method includes providing optical radiation, coupling the optical radiation into a first port of an optical combiner, and transmitting the optical radiation signal from the first port to a second port of the optical combiner. The method also includes coupling the optical radiation signal from the second port into a tunable pulsed source, generating a plurality of signal pulses, and coupling the plurality of signal pulses into the second port. The method further includes transmitting the plurality of signal pulses from the second port to a third port of the optical combiner and outputting the plurality of signal pulses from the third port.

According to an alternative embodiment of the present invention, a method for providing amplified and stabilized laser pulses is provided. The method includes providing an optical radiation signal from an injection laser source and stabilizing a tunable pulsed source based on the optical radiation signal to produce stabilized signal pulses. The method also includes amplifying the stabilized signal pulses in an optical fiber amplifier and outputting the amplified and stabilized signal pulses.

According to another embodiment of the present invention, a laser system for providing laser pulses is provided. The laser system includes an injection laser source characterized by a first wavelength, a first linewidth, a first power, and an output. The terms "injection laser source" and "stabilizing source" are used interchangeably herein. The laser system also includes a tunable pulsed source characterized by a center wavelength, a gain bandwidth, and a second power. The tunable pulsed source has an output signal comprising a set of optical pulses, each of the optical pulses being characterized by a second wavelength and a second linewidth. The laser system further includes an optical combiner having a first port coupled to the output of the injection laser source, a second port coupled to the tunable pulsed source, and a third port. There are a number of possible components or combinations of components that can function as an optical combiner, for example, the optical combiner may be an optical circulator. Alternately, the optical combiner may be a tap coupler. However, the invention is not restricted to these specific optical combiners. The laser system may further include an optical amplifier coupled to the third port. The optical amplifier includes a pump source, an optically active fiber having an input portion configured to receive the output signal from the tunable pulsed source and an output portion. The pump source is optically coupled to the optically active fiber.

According to an embodiment of the present invention, a method for providing laser pulses is provided. The method includes providing a stabilizing optical radiation signal from an injection laser source, coupling the stabilizing optical radiation signal to a first port of an optical combiner, and transmitting the stabilizing optical radiation signal from the first port to a second port of the optical combiner. The method also includes coupling the stabilizing optical radiation signal from the second port into a tunable pulsed source, generating stabilized signal pulses using the tunable pulsed source, and inputting the stabilized signal pulses into the second port. The method further includes transmitting the stabilized signal pulses from the second port to a third port of the optical combiner and providing the stabilized signal pulses from the third port.

According to an embodiment of the present invention, a tunable stable pulsed laser source is provided. The tunable pulsed laser source includes a stabilizing source adapted to generate stabilizing optical radiation. The tunable pulsed laser source also includes a signal source (also referred to as a tunable pulsed source) adapted to produce one or more signal pulses with desired properties including wavelength, spectral linewidth, polarization, pulse energy, pulse length, temporal pulse power profile, or other properties. The tunable pulsed laser source further includes an optical amplifier which serves to amplify the output radiation provided by the signal source. The stabilizing source controls one or more properties of the radiation provided by the signal source. Examples of properties that may be controlled include wavelength, spectral linewidth and polarization, although the controlled properties are not restricted to these particular properties or characteristics.

According to a further embodiment of this invention, a stable tunable high power pulsed laser materials processing system is provided. The processing system includes a stabilized pulsed laser source for providing a first optical signal. The first optical signal includes a plurality of optical pulses. Each of the optical pulses has a stabilized wavelength and a stabilized linewidth. The processing system also includes a wavelength converter coupled to the stabilized pulsed laser source for providing a second optical signal. The second optical signal is associated with the first optical signal. The processing system also includes an optical system configured to receive the second signal from the wavelength converter and to output a laser beam that includes the second signal, and a workpiece holder for supporting a workpiece. The workpiece is configured to receive the laser beam from the optical system. The processing system also includes an electronic signal source driver coupled to the stabilized pulsed laser source and a controller connected to the electronic signal source driver, the stabilized pulsed laser source, the optical system, and the workpiece holder. The processing system further includes a sensor connected to the controller for monitoring a process in the workpiece.

According to an embodiment, the laser processing system also includes an injection laser source characterized by a first wavelength, a first linewidth, a first power, and an output. The laser processing system further includes a tunable pulsed source characterized by a center wavelength, a gain bandwidth, and a second power, the tunable pulsed source having an output signal comprising a plurality of optical pulses. Each of the optical pulses is characterized by a second wavelength and a second linewidth. The laser processing system additionally includes an optical combiner having a first port coupled to the output of the injection laser source, a second port coupled to the tunable pulsed source, and a third port and an optical amplifier coupled to the third port. The optical amplifier includes a pump source, an optically active fiber having an input portion configured to receive the output signal from the tunable pulsed source and an output portion, the pump source being optically coupled to the optically active fiber.

Numerous benefits are achieved using the present invention over conventional techniques. For example, in an embodiment according to the present invention, high power, pulsed lasers suitable for laser processing are provided that utilize a compact architecture that is inexpensive in comparison to lasers with comparable performance characteristics. Moreover, according to embodiments of the present invention, short pulses are generated with pulse characteristics that include a stable center wavelength and narrow spectral linewidth. Other characteristics that may be included include a stable polarization and a reduced divergence. Furthermore, according to embodiments of the present invention, optical pulses can be shaped to optimize the temporal pulse profile for the particular application, to maximize energy extraction efficiency in the laser system, or to compensate for optical amplifier's saturation. Depending upon the embodiments, one or more of these benefits may exist. These and other benefits have been described throughout the present specification and more particularly below. Various additional objects, features and advantages of the present invention can be more fully appreciated with reference to the detailed description and accompanying drawings that follow.

DETAILED DESCRIPTION OF SPECIFIC EMBODIMENTS

Figure 1:
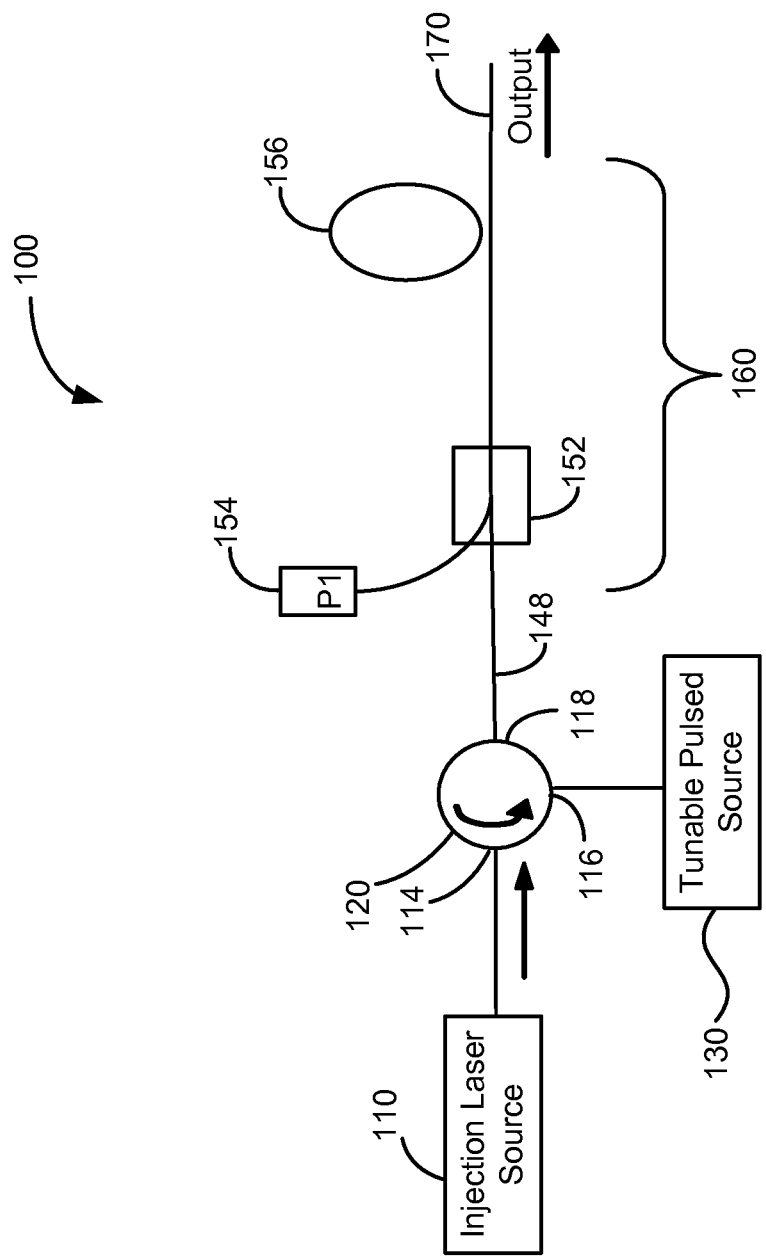
FIG. 1 is a simplified schematic illustration of a high power stable pulsed laser source with tunable pulse characteristics using an optical fiber amplifier according to an embodiment of the present invention.

FIG. 1 is a simplified schematic illustration of a high power pulsed laser system with tunable pulse characteristics using an optical fiber amplifier according to an embodiment of the present invention. High power stabilized pulsed laser 100 includes an injection laser source 110 that generates stabilizing optical radiation, which is injected into a first port 114 of an optical combiner 120 and transmitted to a second port 116 of the optical combiner 120. In one embodiment, the combiner can be a circulator having three or more ports. Such a circulators is available as model OC-3-1064-PM from OFR, Inc. of Caldwell, N.J. According to an embodiment of the present invention, the stabilizing optical radiation is generated by using the injection laser source 110, also referred to as a stabilizing source, that is a continuous wave (CW) semiconductor laser.

In one embodiment, the injection laser source 110 includes a Fiber Bragg Grating (FBG) stabilized semiconductor diode laser operating at a wavelength of 1064 nm with an output power of 20 mW and a spectral linewidth of 70 pm.

In another particular embodiment, the injection laser source 110 includes an external cavity semiconductor diode laser operating at a wavelength of 1064 nm with an output power of 100 mW and a spectral linewidth of 150 pm. In a further particular embodiment, the injection laser source 110 includes a fiber laser, frequency-stabilized using fiber gratings, operating at a wavelength of 1064 nm with an output power of 20 mW and a spectral linewidth of 50 pm.

In an alternative embodiment, the injection laser source 110 includes a distributed feedback (DFB) diode laser or a compact narrow linewidth solid-state laser. The injection laser source may be tunable in wavelength. It is not a requirement of the present invention that the injection laser source be fiber-coupled. In another embodiment, the injection laser source could be a source, such as a vertical-cavity surface-emitting (VCSEL) laser or a short cavity solid state laser, coupled using free space optics. One of ordinary skill in the art would recognize many variations, modifications, and alternatives.

High power stabilized pulsed laser 100 further includes a tunable pulsed source 130 (also referred to as a signal source) that generates a stabilized signal pulse by coupling the stabilizing optical radiation from the injection laser source 110 through the second port. The stabilized signal pulse from the tunable pulsed source 130 is provided to the second port 116 of optical combiner 120 and transmitted to a third port 118 of the optical combiner 120.

The tunable pulsed source 130 may be of a similar type or different format from the injection laser source 110. In a particular embodiment, the tunable pulsed source is a semiconductor diode laser operating at a wavelength of 1064 nm with a peak pulse power of 1 W, a repetition rate variable up to 500 kHz, a pulse width of 100 nanoseconds with a sub-nanosecond pulse risetime. In another embodiment, the peak optical power of the tunable pulsed source may be lower or higher than 1 W. For example, it can be 500 mW, 1 W, 2 W, 3 W, 4 W, 5 W or more. According to some embodiments of the present invention, the output power of the injection laser source is less than the output power of the tunable pulsed source. As examples, the output power of the injection laser source can range from about 20 mW to about 50 mW for a CW injection laser source. The output power of the tunable pulsed source can range from about 1 W of peak power to about 5 W or higher.

Also, the pulse width can be smaller or larger than 100 nanoseconds. For example, it can be 1 ns, 2 ns, 10 ns, 20 ns, 50 ns, 200 ns, 500 ns or more. In another embodiment, the tunable pulsed source can include a semiconductor optical amplifier (SOA) with a first side coupled to the second port 116 of the optical combiner 120 and a second side coupled to a Fiber Bragg Grating (FBG). In this embodiment, the stabilizing optical radiation from the injection laser source 110 emitted through the second port of the optical combiner 120 is injected into the SOA, amplified a first time, reflected from the FBG, re-injected into the SOA, and amplified a second time. The FBG will be characterized by a reflectivity as a function of wavelength. Preferably, the reflectivity of the FBG is high (e.g., close to 100%) over the bandwidth of the tunable pulsed source. As an example, the reflectivity of the FBG is high over a bandwidth that is larger than the spectral width of the injection/stabilizing light source. Merely by way of example, the bandwidth of the grating can be more than three times the bandwidth of the injection laser source, more than twice the bandwidth of the injection laser source, more than the bandwidth of the injection laser source, or the like. In a particular embodiment, the FBG is characterized by a reflectivity greater than 75% over the gain bandwidth of the injection laser source. In another particular embodiment, the reflectivity of greater than 95% over the gain bandwidth. As an example, the reflectivity can be greater than 75% or 95% at the wavelength of the injection laser source 110.

According to some embodiments of the present invention, only a fraction of the output power produced by injection laser source 110 is coupled into the tunable pulsed source 130. As an example, between approximately 50% and 100% of the output power produced by injection laser source 110 is coupled into the tunable pulse source 130. In another example, between approximately 10% and 100% of the output power produced by injection laser source 110 is coupled into the tunable pulse source 130. Typically, it is desirable to inject as much of the power from the injection source into the tunable pulsed source as possible given the constraints of a particular design. In some cases, the injection efficiency is as low as 10%, but embodiments of the present invention are not limited to this efficiency and can operate at lower or higher efficiency.

In alternative embodiments, the stabilized signal pulse provided by the injection laser source 110 can be more complex than a single pulse and can comprise a plurality of pulses, for example two pulses, three pulses, four pulses, five pulses, or the like. In further alternative embodiments, the tunable pulsed source includes an external cavity semiconductor diode laser, a compact solid-state laser, a fiber laser, or the like. One of ordinary skill in the art would recognize many variations, modifications, and alternatives.

The stabilizing optical radiation is injected into the first port 114 of the combiner 120, exits at the second port 116 of the combiner 120, and enters into the tunable pulsed source 130. As the tunable pulsed source emits a signal pulse, the stabilizing optical radiation serves to control and stabilize the center wavelength and the linewidth of the signal pulse. The stabilizing optical radiation can be used to control other properties as well such as polarization. This injection locking through use of an injection laser source is used to control properties of the radiation emitted by the tunable pulsed source 130. The center wavelength and the linewidth are examples of such properties that can be controlled, but the present invention is not limited to these properties. By providing stabilizing optical radiation for which the center wavelength of the injection laser source 110 is within a tolerance of the wavelength of optical gain within the spectral gain bandwidth of the tunable pulsed source 130, locking of the center wavelength of the tunable pulsed source is enabled.

The tunable pulsed source may be optimized to achieve good stabilization under various operating conditions depending on the desired application. In an embodiment, such an optimization can include a choice of an optimal mirror reflectivity of a front reflector of the tunable pulsed source through which the stabilizing optical radiation is injected. This front reflector will reflect part of the stabilizing optical radiation back into the second port of the optical combiner which will be outputted at the third port. The presence of this reflected radiation may be unfavorable, especially if optical amplifier stages are optically coupled to the third port of the combiner. In one embodiment of this invention, the reflectivity of the reflector has a reflectivity of less than 1%, and preferably less than 0.01%. This low reflectivity will minimize background radiation and other undesirable radiation at the output of the laser system, and will also minimize unproductive gain depletion in the optical amplifiers.

Since a portion of the stabilizing optical radiation can be reflected from the front reflector of the tunable pulsed source and from there be transmitted into the second port of the optical combiner and outputted from the third port of the optical combiner, and since such an effect can be disadvantageous, in one embodiment of this invention the stabilizing optical radiation is itself pulsed. The stabilizing pulse begins at a certain point in time before the start of the signal pulse and ends at a certain point in time such that the end of the stabilizing pulse travels from the injection laser source to the tunable pulsed source, arriving some time after the end of the signal pulse. In this embodiment, the duration of the stabilizing pulse will therefore be greater than, or at least equal to, the duration of the signal pulse.

The signal pulse emitted by the tunable pulsed source 130 is provided to the second port 116 of the combiner 120, and exits the combiner 120 at a third port 118. In one embodiment, the third port 118 is coupled to an optical amplifier 160. The signal pulse is received by the optical amplifier 160 at an input end 148 and is then amplified as it passes through optical amplifier 160 resulting in high power optical pulses at an output end 170 of the optical amplifier 160.

Embodiments of the present invention may utilize a fiber amplifier as the optical amplifier 160, including a pump source 154 that is coupled to a rare-earth-doped fiber loop 156 through an optical coupler 152. Generally, a semiconductor pump laser is used as the pump source 154, although pumping of optical amplifiers can be achieved by other means as evident to one of skills in the art.

In one particular embodiment, optical amplifier 160 includes a 5 meter length of rare-earth doped fiber 156, having a core diameter of approximately 4.8 µm and is doped with Ytterbium to a doping density of approximately $6 \times 10^{24}$ ions/$m^3$. The pump source 154 may be an FBG-stabilized semiconductor laser diode operating at a wavelength of 976 nm, and having an output power of 500 mW.

In another particular embodiment, the optical amplifier 160 includes a 2 meter length of rare-earth doped fiber 156, having a core diameter of approximately 10 µm, and is doped with Ytterbium to a doping density of approximately $1 \times 10^{26}$ ions/$m^3$. The pump source 154 may be a semiconductor laser diode having an output power of 5 W although it may be other values. The peak power of the amplified pulses at the output 170 of the laser system could be about 5 kW although the peak power may have other values.

Although the example is given for a Ytterbium-doped fiber amplifier and a laser wavelength of 1064 nm, other examples of diode lasers, solid state lasers, and doped fibers operating at 1064 nm or operating at other wavelengths may be used in embodiments of the present invention. These include, among others, erbium-doped fiber in the wavelength region 1550 nm and thulium-doped fiber in the wavelength region 2 to 3 µm. In one or more of these embodiments, the pump source is optically coupled to the optically active fiber through an optical coupler.

The optical combiner 120 is not limited to an optical circulator with three or more ports, and can be constructed using other components permitting the injection of light from the injection laser source 110 into the tunable pulsed source 130, and permitting the outputting of light from the tunable pulsed source. The optical circulator combines the features of coupling light beams and also isolating ports; however, similar functions can be achieved by assembling components to make an optical combiner. Thus, the optical combiner may include one or more optical couplers and one or more optical isolators. The optical combiner permits the injection of light from the injection laser source into the tunable pulsed source preferably with an optical loss of less than 3 dB, more preferably less than 1 dB, while substantially blocking the light from the tunable pulsed source into the injection laser source by more than 15 dB, preferably more than 20 dB, 25 dB, 30 dB or higher.

Figure 12:
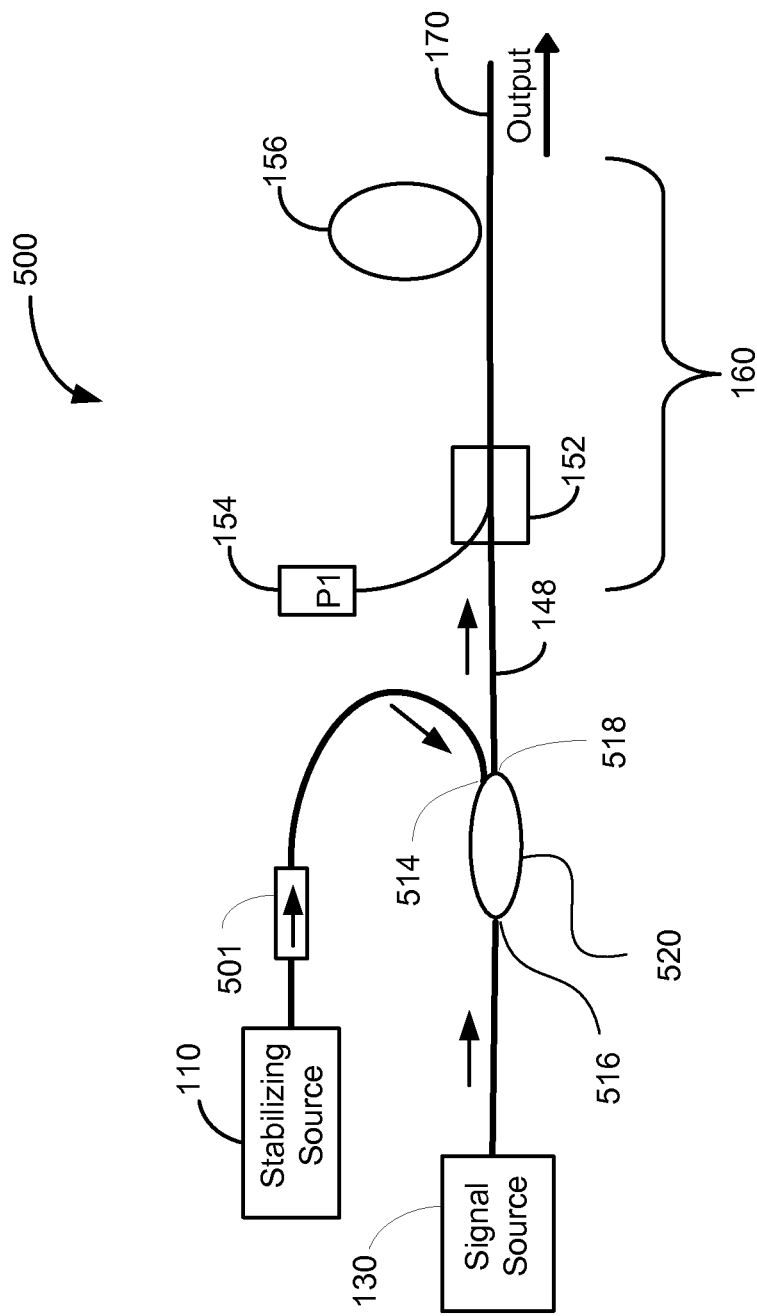
FIG. 12 is a simplified schematic illustration of a high power stable pulsed laser source with tunable pulse characteristics using an optical fiber amplifier according to an embodiment of the present invention.

In one embodiment shown in FIG. 12, the optical combiner can be constructed using a tap coupler 520 to inject light from the injection laser source into the tunable pulsed source, and including an optical isolator 501 to substantially block light travelling from the tunable pulsed source 130 back into the injection laser source 110. Light from the injection laser source 110 is injected into a port 514 of the tap coupler and exits the tap coupler at port 516 from where it enters and controls the tunable pulsed source 130. Light emitted from the tunable pulsed source enters the tap coupler 520 at port 516 and exits the tap coupler at port 518 where it is amplified in the optical amplifier. Light emitted from the tunable pulsed source is substantially blocked from entering the injection laser source 110 by the optical isolator 501. The optical combiner is not limited to only these specific examples, however. Furthermore, the optical combiner is not limited to wholly fiber-coupled optical components, but can also be constructed using free-space optics including but not limited to lenses and mirrors. Other combinations will be apparent to one skilled in the art.

Figure 13:
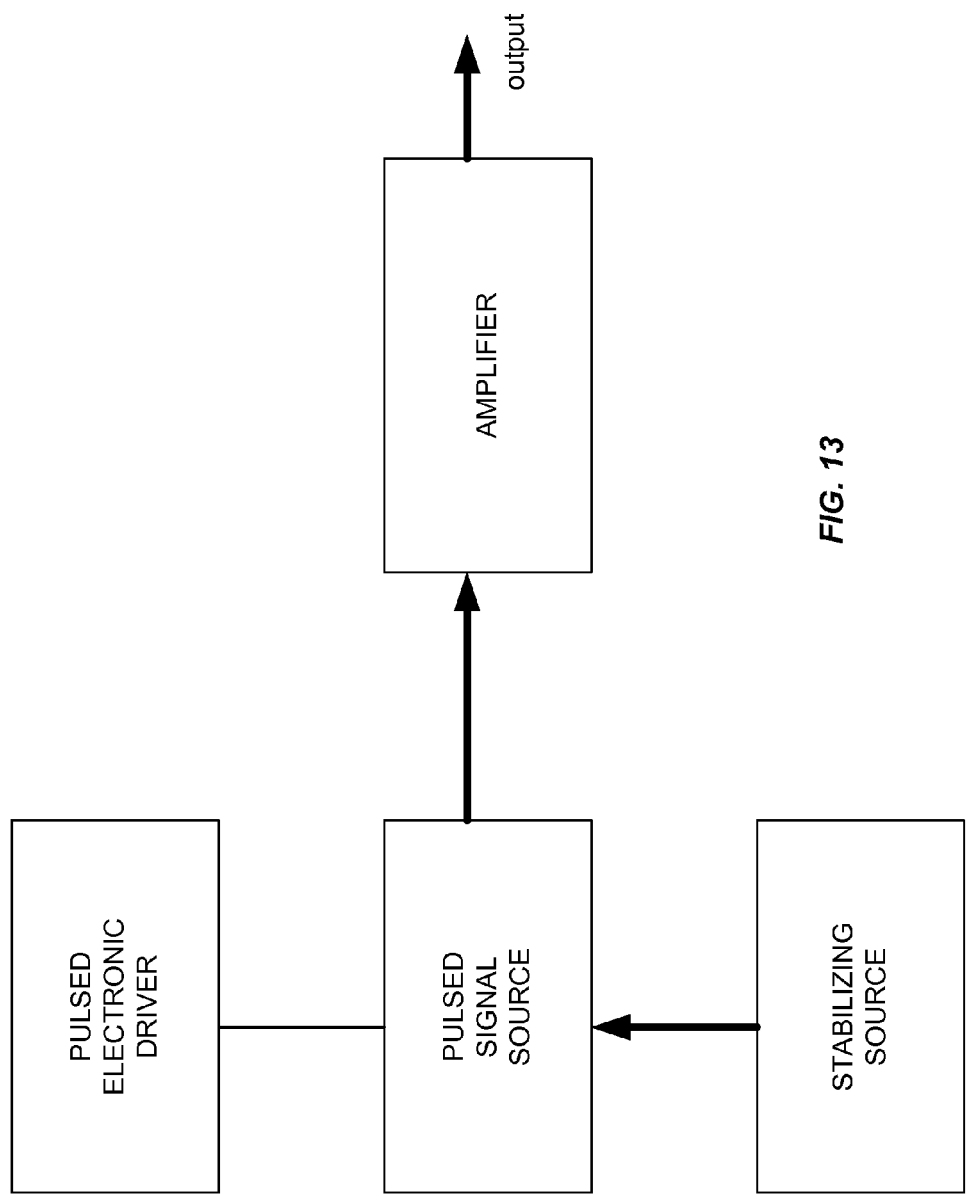
FIG. 13 is a simplified schematic diagram of a high power stable pulsed laser source with tunable pulse characteristics using an optical fiber amplifier according to an embodiment of the present invention.

It is not a requirement of the invention to use an optical combiner. For example, in an embodiment the stabilizing radiation from the injection laser source may be injected into the tunable pulsed source through a partially-transmitting rear reflector. A block diagram illustrating a high power pulsed laser according to an embodiment of the invention is shown in FIG. 13. An electronic signal from a signal source driver (pulsed electronic driver) is used to drive a pulsed signal source that is tunable to provide light pulses with desired properties. In one embodiment, the pulse shape of the pulses output by the pulsed signal source mimics the shape of the electronic pulses used to drive the pulsed signal source as provided by the pulsed electronic driver. In another embodiment, the pulse energy of the pulses output by the pulsed signal source is controlled by the amplitude of the electronic pulses used to drive the pulsed signal source as provided by the pulsed electronics driver. Other properties of the pulses output by the pulsed signal source can also be controlled by the electronic pulses provided by the pulsed electronic driver. The high power laser further includes a stabilizing source that provides light radiation to control properties of the pulsed signal source. Properties of the pulsed signal source that can be controlled using light radiation from the stabilizing source include wavelength, optical linewidth, polarization, and divergence, but not are not restricted to only these examples. The high power laser further includes a fiber amplifier (amplifier) to amplify the light emitted by the pulsed signal source. The amplifier may include one or more stages of amplification using one or more fiber amplifiers.

Figure 2:
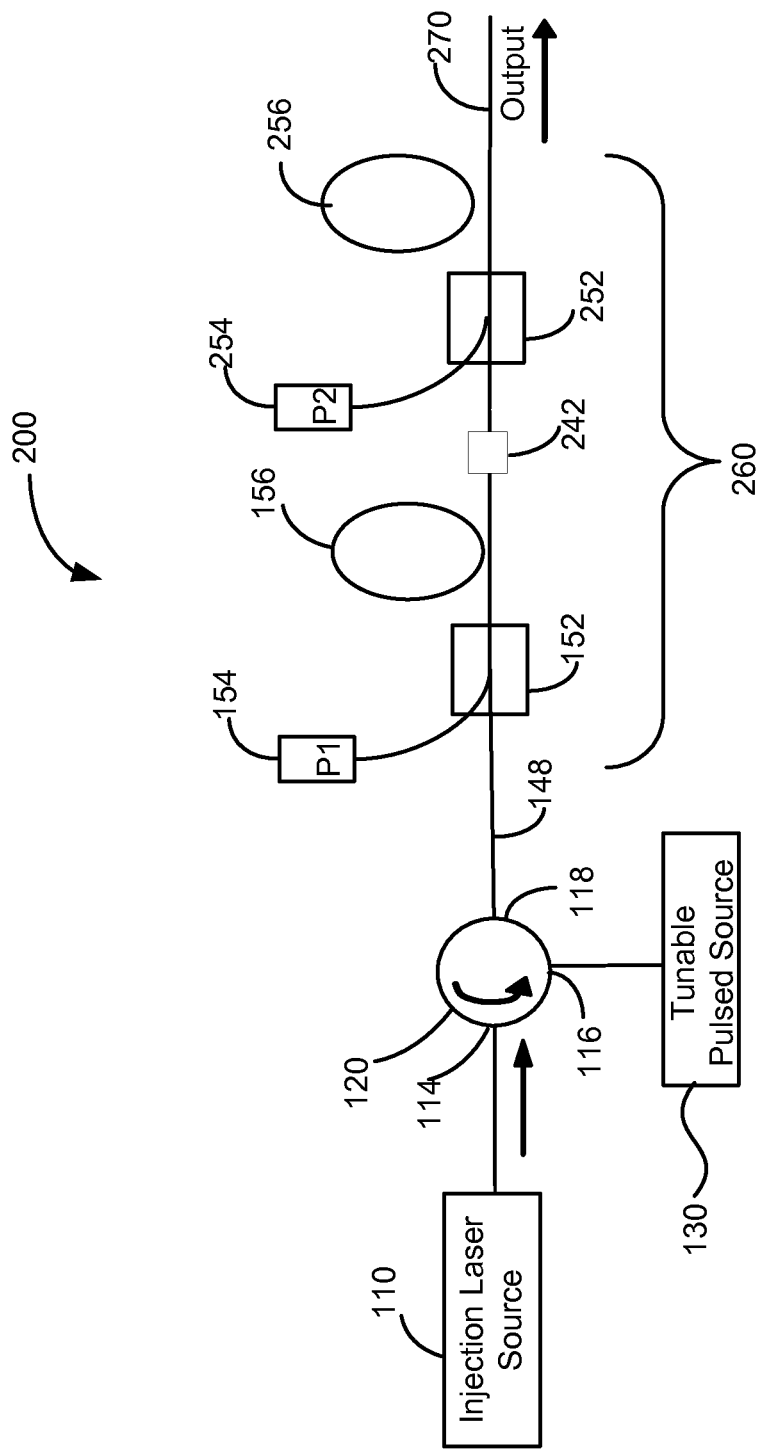
FIG. 2 is a simplified schematic illustration of a high power stable pulsed laser system with tunable pulse characteristics using optical fiber amplifiers according to another embodiment of the present invention.

Although FIG. 1 illustrates the use of a single optical amplifier 160 coupled to the third port 118 of the optical combiner 120, this is not required by the present invention. In alternative embodiments, multiple optical amplifiers may be utilized downstream of the optical combiner 120 as appropriate to any particular application. FIG. 2 is a simplified schematic illustration of a stable high power pulsed laser 200 with tunable pulse characteristics using optical fiber amplifiers according to an embodiment of the present invention. The embodiment illustrated in FIG. 2 provides a two stage amplification process using a two stage optical fiber amplifier 260. An optical isolator 242 may be provided between the two stages of the optical amplifier. The result of two stages of amplification is a higher output pulse power at the output end 270 of the two stage optical amplifier 260. Multiple stages of amplification may provide higher power than a single stage amplification. One of ordinary skill in the art would recognize many variations, modifications, and alternatives. Additional description related to optical sources utilized in embodiments of the present invention can be found in commonly assigned U.S. Pat. No. 7,443,893, entitled "Method and System for Tunable Pulsed Laser Source," the disclosure of which is hereby incorporated by reference for all purposes.

Figure 3:
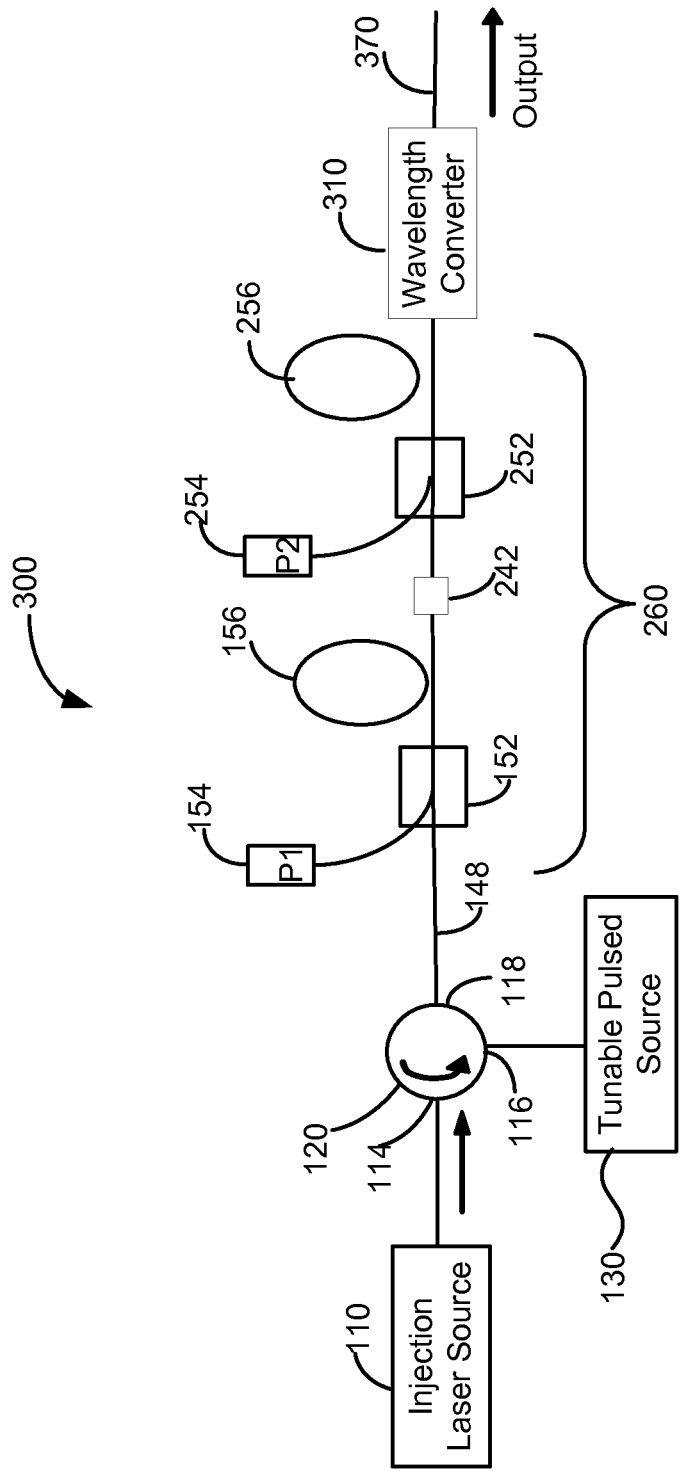
FIG. 3 is a simplified schematic illustration of a high power stable pulsed laser system with tunable pulse characteristics using optical fiber amplifiers according to yet another embodiment of the present invention.

FIG. 3 is a simplified schematic illustration of a stable high power pulsed laser 300 with tunable pulse characteristics that incorporates a wavelength converter 310 to provide laser radiation at an output end 370 of the optical amplifier 260 at wavelengths other than the fundamental wavelength of the laser according to an embodiment of the present invention. As illustrated in FIG. 3, the wavelength converting device is adapted to receive the amplified output of the optical amplifier. Many applications for pulsed laser systems benefit from the use of wavelengths in the ultraviolet, infrared, or visible spectral regions. Wavelength converters using harmonics generation are a technique to convert high power pulsed radiation in the near infrared, for example, convert wavelengths 1064 nm or 1032 nm to shorter wavelengths such as 532 nm or 516 nm by second harmonic generation, and 355 nm or 346 nm by third harmonic generation, and similarly to higher harmonics. Non-linear mixing can also be used to achieve longer infrared wavelengths. Nonlinear crystals such as BBO (beta barium borate), LBO (lithium barium boratetriborate), KTP (potassium dihydrogen titanyl phosphate), and other examples are commonly used for harmonic multiplication, harmonic mixing, parametric mixing, and such like to generate high power radiation at other wavelengths at either shorter or longer wavelengths than the fundamental laser wavelength.

Figure 4:
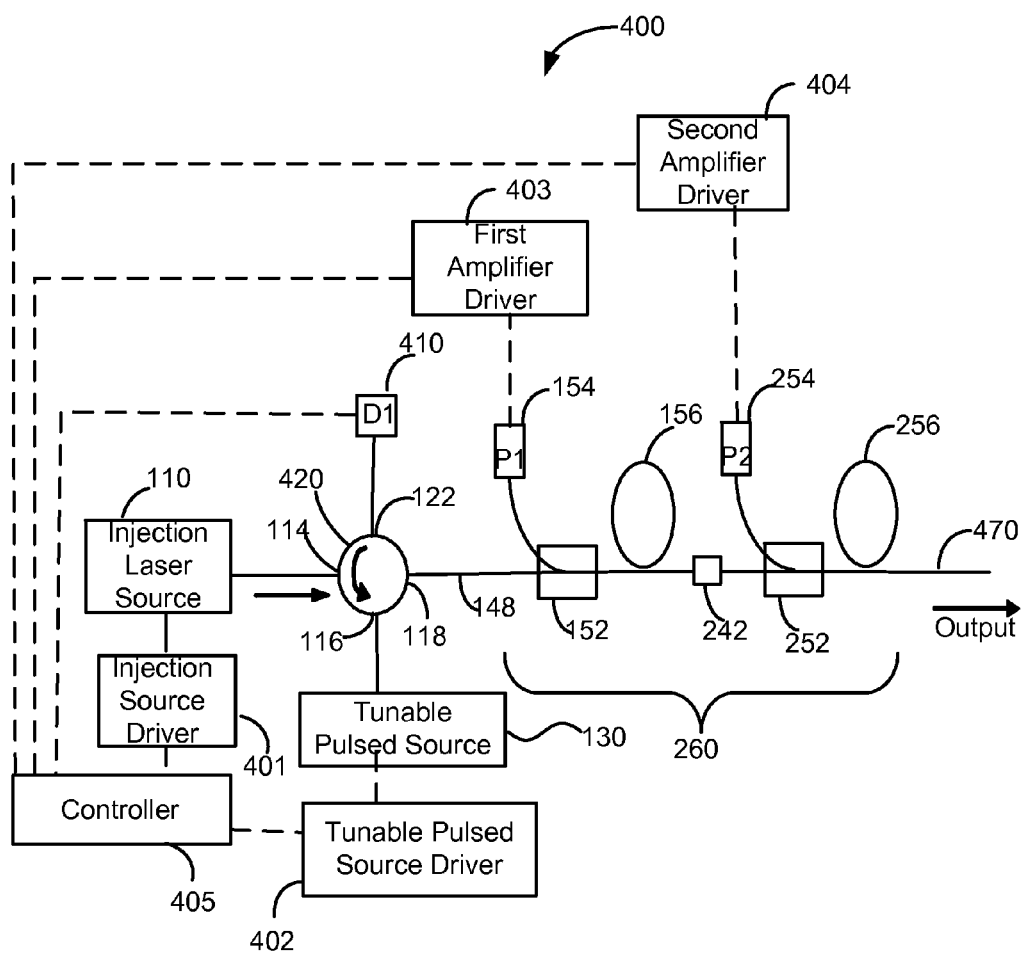
FIG. 4 is a simplified schematic illustration of a high power stable pulsed laser system with tunable pulse characteristics using optical fiber amplifiers according to an alternative embodiment of the present invention.

FIG. 4 is a simplified schematic illustration of a stable high power pulsed laser 400 with tunable pulse characteristics using optical fiber amplifiers according to an embodiment of the present invention. In the embodiment illustrated in FIG. 4, a controller and electronic drivers are shown: an injection laser source driver 401 connected to the injection laser source 110 (also referred to as a stabilizing optical source, a signal source driver 402 connected to a tunable pulsed source 130, a first amplifier driver 403 connected to the first fiber amplifier pump source 154, a second amplifier driver 404 connected to the second fiber amplifier pump source 254 wherein all four electronic drivers are connected to a controller 405. The controller 405 is typically a computer or computers which are programmed to control the operation of the laser system.

In particular, the controller 405 may provide the information required to generate a desired train of pulses from the tunable pulsed source 130 so that the output train of pulses 470 has the desired properties for a particular application. Such properties include pulse peak power, pulse length, the time interval between pulses, the pulse risetime and falltime, the temporal pulse shape, and the like. This information can also be used by the controller to optimize the properties of the amplifier system 260 by controlling the first amplifier driver 403 and the second amplifier driver 404. For example, in the case of a low peak power signal pulse, it may be beneficial to provide a reduced pumping power from the second fiber amplifier pump source 254 so as to reduce amplified stimulated emission (ASE); this information can be sent by the controller to the second amplifier driver 404. Also, this information can be used by the controller 405 to optimize the temporal pulse shape such as to reduce gain saturation in optical fiber amplifiers. Additional information can be found in commonly-assigned U.S. Pat. No. 7,428,253 entitled "Methods and Systems for a Pulsed Laser Source Emitting Shaped Optical Waveforms", the disclosure of which is hereby incorporated by reference for all purposes. Furthermore, this information can be used by the controller 405 to optimize the pulse shape such as to reduce any nonlinearity or thermal effects in the tunable pulsed source. In tunable pulsed sources using semiconductor diode lasers, long pulse width—for example 100 ns, 200 ns, 500 ns or longer—can lead to pulse deformation because of heating of the active region of the semiconductor laser.

Referring to FIG. 4, an embodiment of the present invention may include a combiner 420 having first, second, third, and fourth ports 114, 116, 118, and 122, and a detector 410 coupled to the fourth port 122 of the combiner 420. The detector 410 would monitor counter-propagating light moving backwards through amplifier 260. The counter-propagating light would enter the combiner at the third port 118 and exit the combiner 420 at the forth port 122, and would be then detected by the detector 410. Such counter-propagating light would include backwards stimulated Raman light, stimulated Brillouin scattering, backwards ASE, reflected light, or other possible examples. The detector 410 is coupled to the controller 405 to provide feedback about the detected counter-propagating light.

By detecting and monitoring this light moving backwards through the amplifier 260, the performance of the laser system can be optimized by using the controller 410. For example, the presence of a high level of backwards ASE would indicate that the gain is not being depleted in the fiber amplifier 260. The controller could then reduce the pumping power provided to the fiber amplifier by sending a direction to the first amplifier driver 403 or the second amplifier driver 404. Alternatively, the controller could increase the signal peak power by sending a direction to the signal source driver 402. There are many examples known to those skilled in the art to use the data collected by the detector 410 to optimize and control the performance of the laser. Additional information can be found in commonly assigned U.S. Pat. No. 7,667,889, entitled "Methods and Systems for Gain Control in Pulsed Optical Amplifiers," the disclosure of which is hereby incorporated by reference for all purposes.

It will be appreciated by one skilled in the art that the optical pulse parameters of the signal pulse provided by the tunable pulsed source 130 will be determined, in part, by the equivalent current pulse parameters of the driving current provided by the signal source driver 402. Such parameters include pulse width, risetime, falltime, peak power, temporal pulse shape, and the like. In many cases, the shape of the optical pulse and the shape of the driving current pulse are essentially identical. Thus, to achieve a train of optical pulses of arbitrary shape changing as desired from pulse to pulse, a similar change in the driving current pulse train is provided. In this manner, it is possible to achieve the desired pulse parameters for each signal pulse by making appropriate adjustments to the pulse parameters of the driving current provided by the signal source driver 402. The directions to provide the pulse parameters of the driving current are sent to the signal source driver 402 from the controller 405.

As illustrated in FIG. 4, the laser system can include a controller electrically coupled to the injection laser source and the tunable pulsed source. The controller is operable to adjust laser parameters of the tunable pulsed source and the injection laser source. In some embodiments, the optical combiner includes a fourth port coupled to a detector. The signals received from the detector can be provided as inputs to the controller. Additionally, the laser system can also include an electronic signal source driver coupled to the tunable pulsed source and the controller.

Figure 5A:
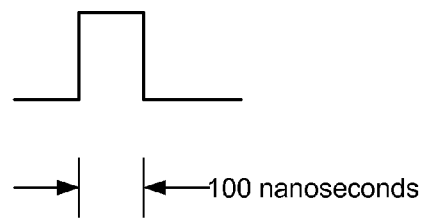
FIGS. 5A-5D illustrate examples of various temporal pulse shapes, pulse trains, and pulse intervals provided by embodiments of the present invention.
Figure 5B:
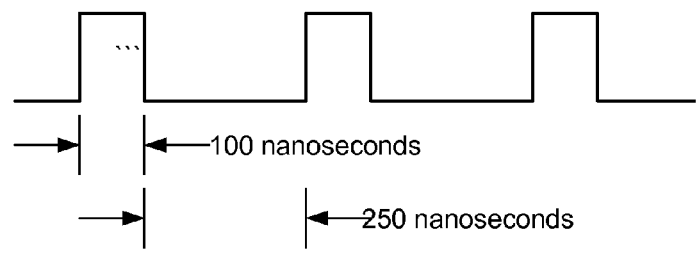
Figure 5C:
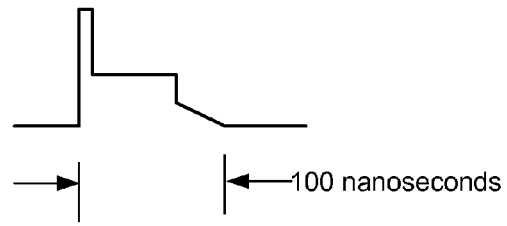
Figure 5D:
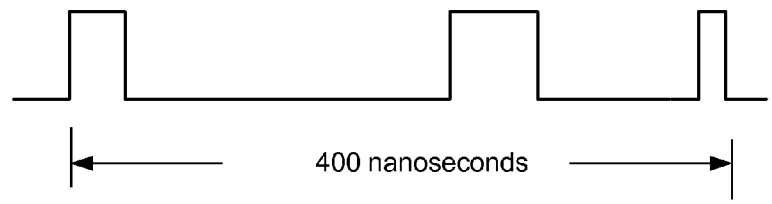

Thus, according to embodiments of the present invention, pulses of desired shape, such as a square top pulse shown in FIGS. 5A and 5B, can be generated. Likewise, pulses with arbitrary shape, such as shown in FIG. 5C, can also be generated. Furthermore, pulse trains with arbitrary intervals between pulses, such as shown in FIG. 5D, can also be generated. One of ordinary skill in the art would recognize many variations, modifications, and alternatives in signal pulses including temporal pulse shapes, pulse trains, and pulse intervals. For example, combinations of pulses illustrated in FIGS. 5A-5D can be provided by embodiments of the present invention.

It may be desirable to be able to change the operating wavelength of the laser to match a certain application. This may involve a large change in wavelength. For example, such a large change in wavelength may be achieved using wavelength shifting by harmonic generation in nonlinear crystals or nonlinear mixing in nonlinear crystals as described earlier It may also be desirable to make small changes in the wavelength to match a particular resonance or resonances in the material to be processed. According to embodiments of this invention, the center wavelength may be shifted by adjusting the center wavelength of the stabilizing optical radiation emitted by the injection laser source 110 that is tunable as described earlier. Referring to FIG. 4, the injection laser source driver 401 may be used to change the stabilizing optical radiation center wavelength from pulse to pulse, following directions provided by the controller 405.

Figure 6A:
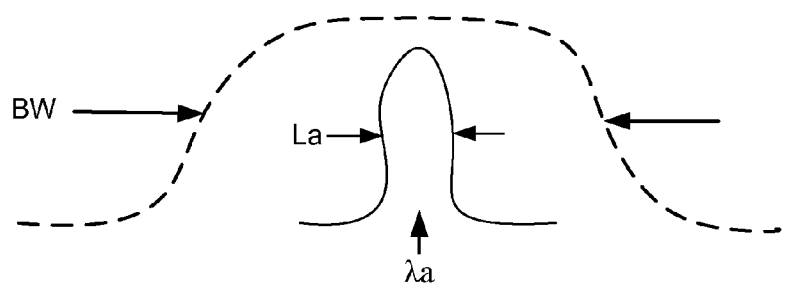
FIG. 6A illustrates typical spectral characteristics of various signal pulses without stabilization.
Figure 6B:
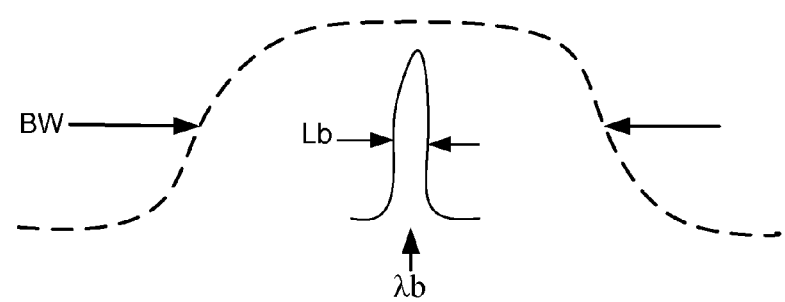
FIGS. 6B-C illustrate typical spectral characteristics of various signal pulses stabilized by using an injection laser source.
Figure 6C:
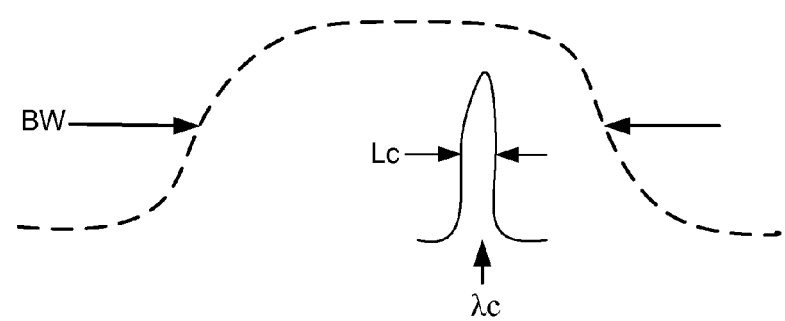

FIG. 6A illustrates a typical example of laser emission from an unstabilized tunable pulsed source. FIGS. 6B and 6C illustrate typical examples of locking of the center wavelength and linewidth of the pulsed signal using optical stabilizing radiation. Note that a linewidth La without stabilization is broader than linewidths Lb and Lc with stabilization, shown in FIGS. 6B and 6C. The tunable pulsed source exhibits a spectral region over which optical gain is present; the spectral bandwidth (BW) of the tunable pulsed source is the width of the spectrum FWHM over which gain is present. The spectral bandwidth of the tunable pulsed source is determined by materials of construction and doping levels of the tunable pulsed source. The linewidth La of the pulsed optical signal may be substantially narrower than the spectral bandwidth of the tunable pulsed source due to a process known as gain narrowing. The spectral bandwidth may be about ten times the spectral linewidth of the pulsed signal. According to some embodiments of the present invention, the linewidth of the injected signal is narrower than the gain bandwidth of the tunable pulsed laser. As well as achieving desired spectral properties such as wavelength and linewidth of each pulse of the pulsed optical signal by using injection locking, another advantage of injection locking is to stabilize those properties so that each pulse of the pulsed optical signal will have substantially the same wavelength, linewidth, and other properties as the other pulses in the pulse train.

Without the presence of any stabilizing radiation, the radiation emitted by the tunable pulsed source will build up from noise within an optical resonator cavity of the tunable pulsed source and the signal pulse has a center wavelength $\lambda a$ and linewidth La. The center wavelength may be determined by a combination of factors, such as the wavelength of maximum optical gain and the wavelength reflectivity profile of the tunable pulsed source resonator optics. The center wavelength and linewidth of the signal pulse may also be affected by other factors, such as temperature, or the electrical drive current being applied. For example, rapidly changing electrical current can lead to wavelength chirping during a pulse which is effectively a broadening of the linewidth. Thus, without the presence of stabilizing radiation, the emitted central wavelength, linewidth and other properties may vary depending on the environment, the pulsed signal repetition rate, the waveform, and a variety of other factors.

Such variations like linewidth broadening and center wavelength shift are not desirable and may lead to reduced efficiency or other undesirable effects in material processing, or reduced efficiency when converting from a fundamental wavelength to another wavelength using nonlinear effects such as harmonic generation. Instead of allowing the signal pulse to build up from noises, it is advantageous to control the center wavelength, linewidth, polarization, and other properties using an injection laser source to provide a stabilizing signal to the tunable pulsed source.

The stabilization of linewidth, center wavelength, and other properties may be achieved when a stabilizing radiation is present in the optical resonator cavity of the tunable pulsed source at a level significantly higher than background noise per unit wavelength. A results of this situation may be that the spectrum of the output from the tunable pulsed source is substantially similar to the spectrum of the stabilizing radiation and largely independent of the electronic drive conditions of the tunable pulsed source. For example, referring to FIG. 1, the stabilizing radiation from the injection laser source 110 emits the radiation into the first port 114 of the combiner 120 within which it transmits to the second port 116 of the combiner 120 and exits the second port 116 to enter the optical resonator cavity of the tunable pulsed source 130. When the stabilizing optical radiation of center wavelength $\lambda b$ and linewidth Lb from the injection laser source 110 is present in the optical resonator cavity of the tunable pulsed source 130 at a power level significantly higher than background noise, the signal pulse builds up from that stabilizing optical radiation and the center wavelength of the signal pulse would be kb and the linewidth would be approximately Lb. Likewise, if the center wavelength and linewidth of the stabilizing optical radiation is changed to $\lambda c$ and Lc respectively, as illustrated in FIG. 6C, the center wavelength and the linewidth of the signal pulse would change to $\lambda c$ and approximately Lc, respectively. Note that the center wavelength of the injection laser source 110 is within the gain bandwidth of the tunable pulsed source 130, as illustrated in FIGS. 6B and 6C.

Figure 7:
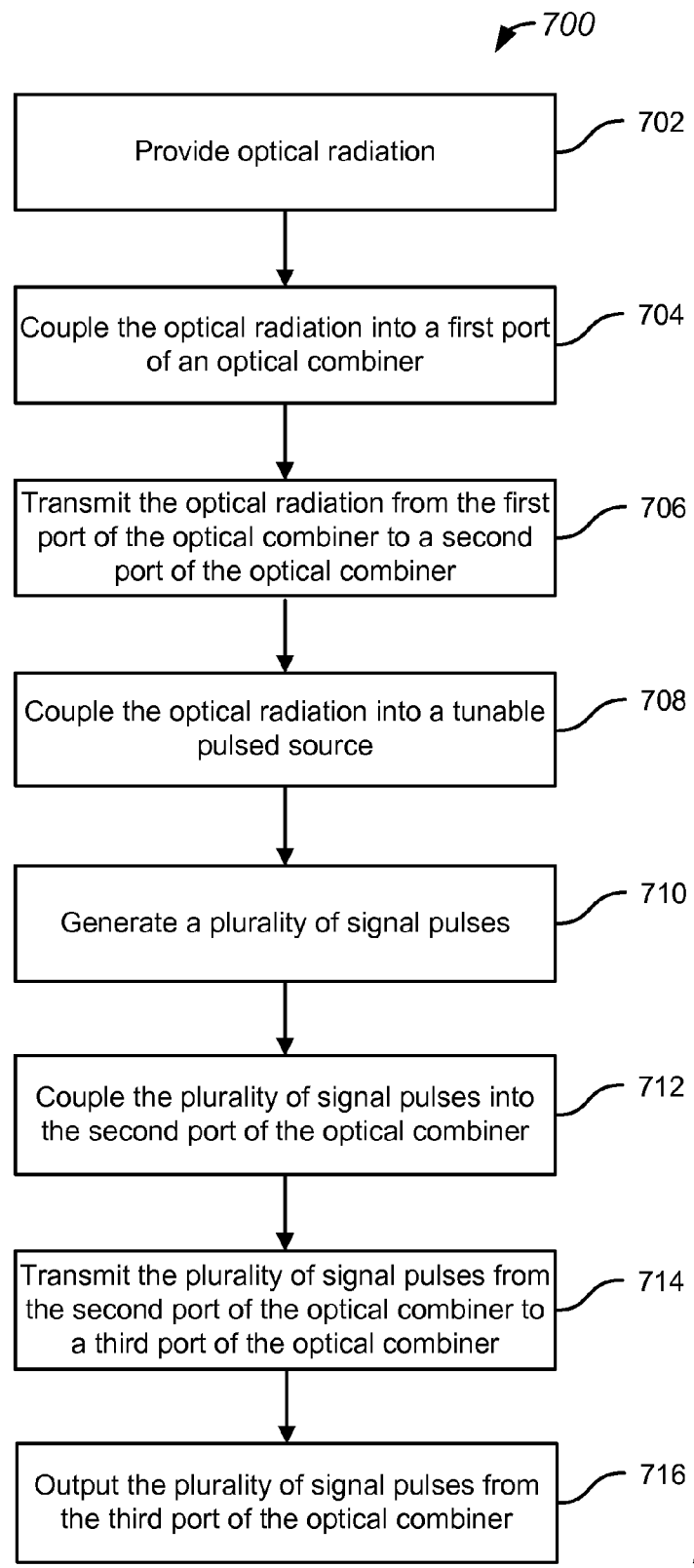
FIG. 7 is a simplified flowchart illustrating a method of providing stabilized laser pulses according to an embodiment of the present invention.

It is possible to injection lock lasers in this manner using stabilizing optical radiation with very low power levels, such as microwatt or milliwatt ranges. For example, the power of the optical stabilizing radiation emitted by the injection laser source may be as much as 50 mW or more, or as low as 0.5 mW or less. Also, the stabilizing radiation spectral properties can be chosen depending on the application. For example, the spectral properties can be chosen to minimize nonlinear effects like Stimulated Brillouin Scattering (SBS) in optical fiber amplifiers, or to optimize optical harmonic conversion in nonlinear crystals. SBS in optical fiber amplifiers is strongly dependent on a narrow signal linewidth propagating in the fiber. In one embodiment of this invention, the injection laser source is a FBG stabilized semiconductor diode laser, where the FBG reflectivity and bandwidth are chosen to provide a broad linewidth between 50 pm and 500 pm to reduce SBS generation. Likewise, the central wavelength doesn't need to be 1064 nm, but can be another wavelength such as for example 976 nm, 1030 m, 1300 nm, 1550 nm or a choice of many other wavelengths. The present invention combines the generation of high peak power optical pulses from the tunable pulsed source with controlled spectral and other characteristics of the injection laser source. Other characteristics which may be controlled by the injection laser source include polarization and divergence. For example, polarized beams can be important in some materials processing applications. The characteristics which may be controlled by the injection laser source are not restricted to only those mentioned FIG. 7 is a simplified flowchart illustrating a method of providing laser pulses characterized by a stabilized center wavelength and linewidth. The method 700 includes providing optical radiation (702). As an example, the optical radiation can be generated using an injection laser source and then used to stabilize a second laser as described more fully throughout the present specification. The optical radiation can be generated using an injection laser source, also referred to as a stabilizing laser source. The injection laser source may be a fiber Bragg grating stabilized semiconductor diode laser, a CW semiconductor laser, a pulsed semiconductor laser, a fiber laser, combinations thereof, or the like. The optical radiation is coupled into a first port of an optical combiner (704) and transmitted from the first port of the optical combiner to a second port of the optical combiner (706). The method also includes coupling the optical radiation signal from the second port into a tunable pulsed source (708). The optical radiation will be used to stabilize the emission generated in the tunable pulsed source, which can also be referred to as a signal source.

The method further includes generating a plurality of signal pulses using the tunable pulsed source (710) and coupling the plurality of signal pulses into the second port of the optical combiner (712). Since the signal pulses are stabilized by the injection locking provided by the injection laser source, the signal pulses can be referred to as stabilized signal pulses. The method additionally includes transmitting the plurality of signal pulses from the second port to a third port of the optical combiner (714) and outputting the plurality of signal pulses from the third port (716). As discussed throughout the present specification, the optical combiner can be an optical circulator.

According to a particular embodiment of the present invention, the method also includes coupling the plurality of signal pulses into an input end of an optical amplifier, amplifying the plurality of signal pulses, and outputting the plurality of amplified signal pulses at an output end of the optical amplifier. Thus, this particular embodiment can provide amplified and stabilized optical pulses. The optical amplifier can include a pump source optically coupled to an optically active fiber, for example, a rare-earth-doped fiber, through an optical coupler.

It should be appreciated that the specific steps illustrated in FIG. 7 provide a particular method of providing stabilized optical pulses according to an embodiment of the present invention. Other sequences of steps may also be performed according to alternative embodiments. For example, alternative embodiments of the present invention may perform the steps outlined above in a different order. Moreover, the individual steps illustrated in FIG. 7 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 8:
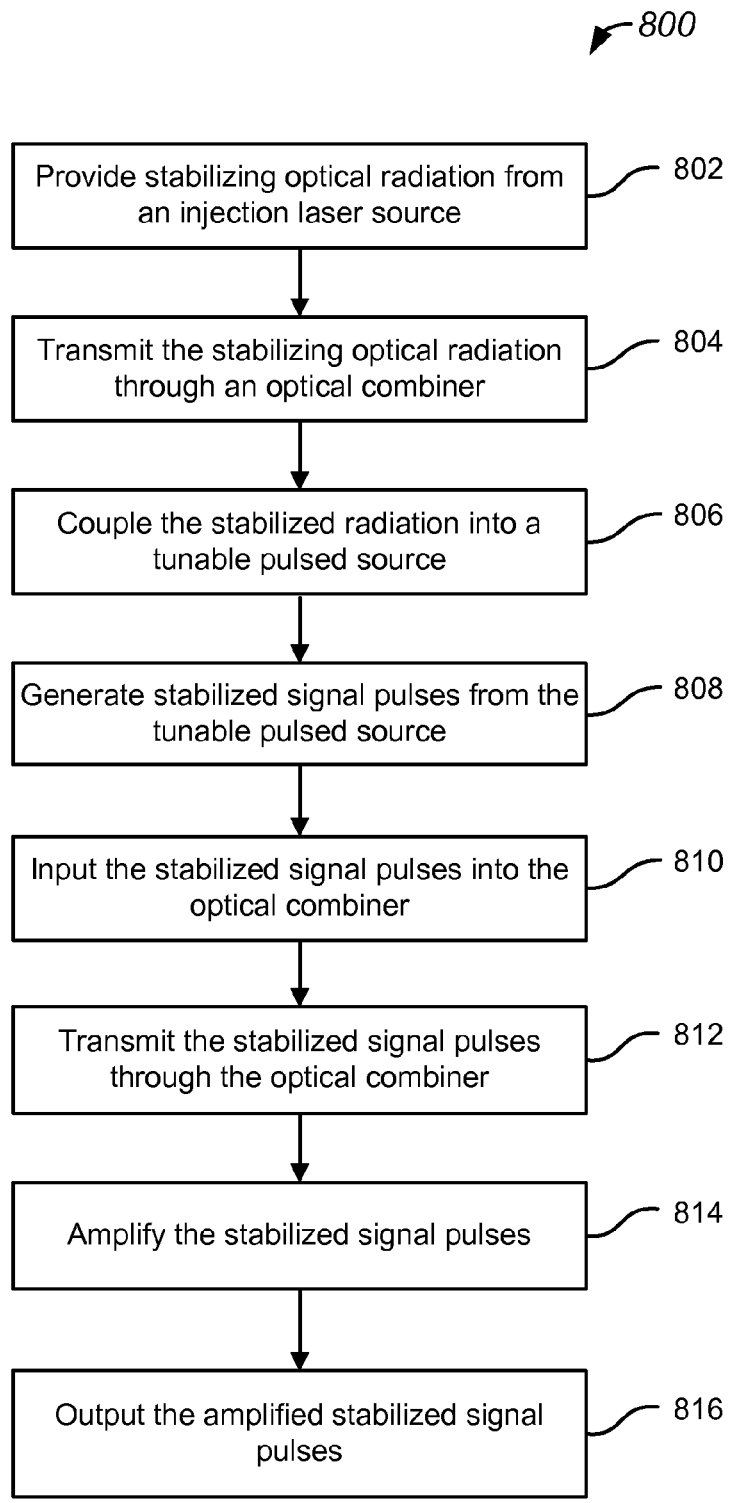
FIG. 8 is a simplified flowchart illustrating a method of providing amplified stabilized laser pulses according to an embodiment of the present invention.

FIG. 8 is a simplified flowchart illustrating a method of providing amplified signal pulses characterized by a stabilized center wavelength and linewidth. The method 800 includes providing stabilizing optical radiation from an injection laser source or stabilizing laser source (802). The method also includes coupling the stabilizing optical radiation to a first port of an optical combiner and transmitting the stabilizing optical radiation from the first port to a second port of the optical combiner (804) and coupling the stabilizing optical radiation from the second port of the optical combiner into a tunable pulsed source (806). The method further includes generating stabilized signal pulses from the tunable pulsed source (808) and inputting the stabilized signal pulses into the second port of the optical combiner (810).

The method additionally includes transmitting the stabilized signal pulses from the second port to a third port of the optical combiner and receiving the stabilized signal pulses from a third port of the optical combiner at an input end of an optical amplifier (812). The stabilized signal pulses are amplified (814) and output from an output end of the optical amplifier (816). The amplification can be performed using a rare-earth-doped fiber amplifier.

It should be appreciated that the specific steps illustrated in FIG. 8 provide a particular method of providing amplified and stabilized optical pulses according to an embodiment of the present invention. Other sequences of steps may also be performed according to alternative embodiments. For example, alternative embodiments of the present invention may perform the steps outlined above in a different order. Moreover, the individual steps illustrated in FIG. 8 may include multiple sub-steps that may be performed in various sequences as appropriate to the individual step. Furthermore, additional steps may be added or removed depending on the particular applications. One of ordinary skill in the art would recognize many variations, modifications, and alternatives.

According to embodiments of the present invention, systems are provided that result in the generation of sequences of optical pulses, which may not be equally separated in time. Moreover, the pulse widths and pulse energies can be individually tailored in a predetermined manner from pulse to pulse. If desired, the center wavelength of the laser can be shifted from pulse to pulse. Laser-based material processing such as marking, engraving, micromachining, and cutting has made extensive use of high peak power pulse lasers. Depending on the applications and the material to be processed, the pulse characteristics can be adapted for the task at hand. For several applications, it is preferable to process with a specific optical temporal pulse shape, such as square pulse, and a deformation of such a pulse may not be desirable. For example, in the field of laser processing of conductive links on memory chips it can be advantageous to use substantially square optical pulses. In other applications, it may be advantageous to use linearly-polarized light.

Figure 9:
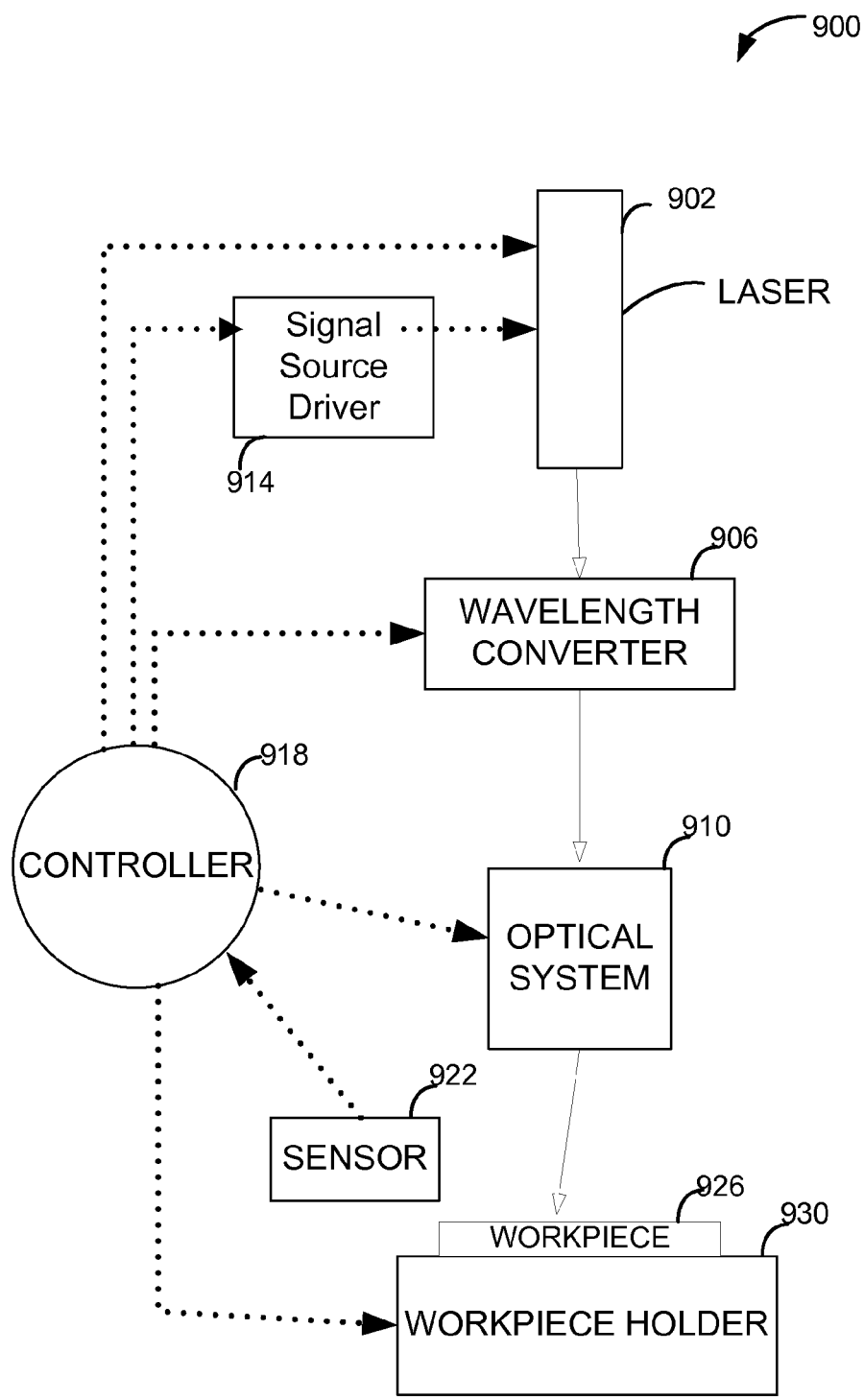
FIG. 9 is a simplified schematic illustration of a high power stable pulsed laser processing system according to an embodiment of the present invention.

According to one particular embodiment of the present invention, FIG. 9 shows an exemplary laser processing system 900. The system 900 includes a laser source 902, a wavelength converter 906, a Signal Source Driver 914, an optical system 910, a controller 918, a sensor 922, and a workpiece 926 that is positioned on top of a workpiece holder 930. The laser source 902 provides laser pulses with certain characteristics, such as wavelength, pulse length, temporal pulse shape, and pulse repetition rate. The wavelength may be selected by the controller 918. The wavelength may also be adjusted through the wavelength converter by using the controller 918. The pulse length, temporal pulse shape, and pulse repetition rate may be adjusted by the controller 918 through the signal source driver 914 according to an embodiment of the present invention. The controller 918 may provide information for processing a particular material, such as optimal temporal pulse shape and pulse length for processing the particular material.

A wavelength generated by the laser source 902 may be converted to a harmonic of a fundamental wavelength by the wavelength converter 906, such as a second, third, or fourth harmonic wavelength. Although some systems use different lasers, it is possible to obtain different wavelengths from one laser using a well-known process of harmonic generation in non-linear crystals. For example, ultraviolet light having a wavelength of approximately 353 nm may be obtained from an infrared laser having a wavelength of 1.064 µm by using harmonic tripling in a non-linear crystal. The wavelength converter 906 may include a beam directing device, such as galvanometer-mounted mirrors. The mirrors may quickly change the path of a laser beam from the laser source 902 to bypass the wavelength converter 906 by using the controller 918.

The optical system 910 may be used to adjust beam shape or spot size of the beam. The optical system 910 may include lenses and mirrors for focusing a laser beam on the workpiece 926, and a component for directing the beam to various positions on the workpiece 926. In a specific embodiment, the component for directing the beam may be mirrors mounted on galvanometers. The controller 918 may be used to control the optical system 910 and the motion of the component for directing beam. For example, when cutting a hole in the workpiece 926 in a trepanning process, the optical system 910 may be controlled by the controller 918 to scan the beam in a circle on the area where the hole needs to be cut. Alternatively, when cutting a hole in the workpiece 926 in a percussion process, a laser beam is directed toward an area where the hole needs to be cut and may be pulsed multiple times to drill the hole directly. The laser beam may process each small area of the workpiece 926 held on a workpiece holder 930 with a movable stage by moving the workpiece holder 930 controlled by the controller 918.

Many applications may require multiple processing steps by using different laser beams. In some cases, the process may not be reproducible enough so as to allow precise prediction of a particular time to change laser parameters. In such cases, the laser system 900 may use the sensor 922 as an indicator to detect and indicate that one of the process steps has been completed. The sensor 922 may then provide a feedback signal to the controller 918 that is in communication with the laser source 902 through the signal source driver 914 to switch to another processing step. One benefit of using the sensor 922 is that the information obtained by the sensor 922 may be used to provide a feedback signal to the controller 918 to change or optimize laser parameters with no delay in laser processing.

There are many ways of using sensors to monitor a processing sequence or step. In one embodiment of the invention, the sensor 922 may be a vision system for viewing the workpiece 926 as the laser processing occurs, such as a video camera. In another embodiment of the invention, the sensor 922 may be a photodiode for detecting an indicator such as a change in the light emitted from the workpiece 926. In yet a further embodiment of the invention, the sensor 922 may be an audio detector near the workpiece 926 for detecting an indicator such as a change in pitch or loudness of sound during a laser processing. One of ordinary skill in the art would recognize many variations, modifications, and alternatives.

Lasers may be used in processing a workpiece 926 that comprises a homogeneous material or a multilayer structure of different materials. For example, a laser is often used to remove a metal conductor between two contacts where the metal forms part of a circuit deposited on an insulating substrate that comprises a glass or a dielectric material. The workpiece 926 may be a multilayer structure having at least two layers of different materials.

Figure 10A:
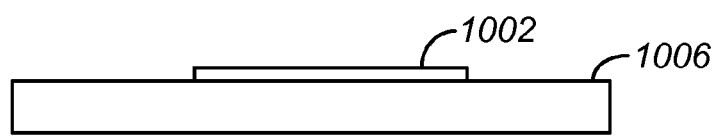
FIGS. 10A-10C are simplified illustrations of an exemplary two layer structure processed using the laser system shown in FIG. 9.
Figure 10B:
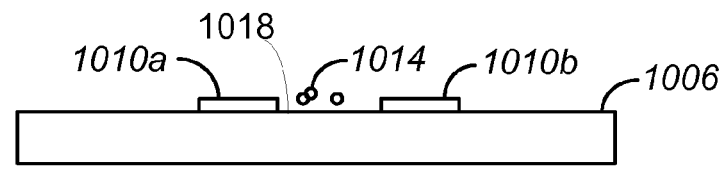

FIG. 10A shows an example of a thin layer metal 1002 on a glass substrate 1006. As one example, the metal may be aluminum. FIG. 10B shows that a portion of the metal layer 1002 is removed by using a first set of laser pulses. Three regions are formed, including a region 1018 that contains some debris 1014 generated from the removal of the metal layer 1002, regions 1010*a* and 1010*b* that are the remaining portions of the metal layer 1002 on each side of the region 1018. The first set of laser pulses includes two high energy and short pulses for quick removal of a portion of the metal layer 1002.

Figure 10C:
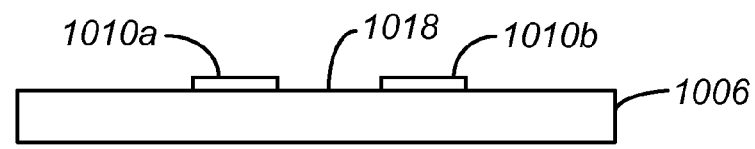

Referring to FIG. 10C now, the debris 1014 in the region 1018 is removed or cleaned by using a second set of laser pulses. A first set of laser parameters is changed to a second set of laser parameters when the metal layer 1002 is removed from the glass substrate 1006. The second set of laser pulses includes five low energy and long pulses for cleaning the debris 1014 without damaging the glass substrate 1006.

In a specific embodiment of the invention, the laser wavelength may be 1064 nm and a ytterbium-doped fiber amplifier may be used. In the first process of partially removing the metal layer 1002, a first set of laser pulses may each have a pulse length of 5 ns and a pulse energy of 0.2 mJ. In the second process of cleaning the debris 1014, a second set of laser pulses may each have a pulse length of 100 ns and a pulse energy of 0.05 mJ. In both the first and second processes, a pulse repetition rate of 20 kHz may be used.

Another common application may use lasers to drill via holes through a multilayer circuit board, where each of the multilayer alternates between a conductor (e.g. copper) and an insulator (e.g. glass filled epoxy or thermoplastic). Each layer may require a different set of laser parameters to optimize laser processing for the particular material of the circuit board. For example, long square pulses may be used for annealing or cleaning, while short pulses or ultrafast pulses may be used for precise removable of small amounts of materials. Although the short pulses may produce a very clean or sharp edged removal of materials, the removable rate from the short pulses may be lower than the long pulses because less energy is associated with the short pulses. Therefore, it is important to select temporal pulse shape, pulse length, pulse energy for a particular material to optimize the laser processing.

Figure 11:
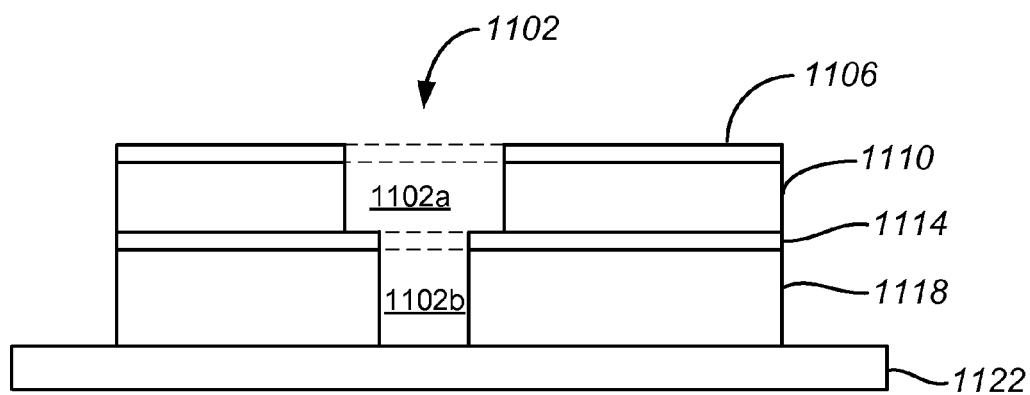
FIG. 11 is a simplified illustration of an exemplary multilayer circuit board with via holes drilled using the laser system shown in FIG. 9.

FIG. 11 shows a simplified sectional diagram of a circuit board. The circuit board 1100 comprises a first layer 1106 of a first material, a second layer 1110 of a second material, and a third layer 1114 of the first material, a fourth layer 1118 of the second material and a substrate 1122. In some embodiments, the substrate or the circuit board are referred to as a workpiece. Round via hole 1102*a* is drilled through the first and second layers 1106 and 1110 by using laser pulses, and round via hole 1102*b* is drilled through the third and fourth layers 1114 and 1118. The first material may be a metal, such as copper, while the second material may be a polymer, such as polyimide. The first and second layers 1106 and 1110 may have a different size of via 1102a than the via 1102b in the third and fourth layers 1114 and 1118.

In a specific embodiment of the invention, the laser source 1102 may have a fundamental wavelength of 1064 nm. When drilling through the first layer 1106 and the third layer 1114 of the first material (e.g. copper), a third harmonic wavelength of the laser source 1102 (353 nm ultraviolet) may be used, because the fundamental wavelength of 1064 nm is substantially reflected by metals like copper. Laser parameters may include a pulse energy of 0.05 mJ, and a pulse length of 5 ns. The ultraviolet light may be focused on a small spot size to provide a high energy density of at least 50 J/cm2. Vias 1102a and 1102b may be formed by a trepanning drilling in the first and third layers 1106 and 1114 of the first material (e.g. copper) with laser pulses at a pulse repetition rate of 50 kHz.

When drilling through the second layer 1110 and fourth layer 1118 of the second material (e.g. polyimide), a fundamental wavelength of 1064 nm may be used by configuring mirrors to direct the laser beam from the laser source 1102 to bypass the wavelength converter 1106. Via holes 1102a and 1102b in the second and fourth layers 1110 and 1118 may be formed by a percussion drilling with a pulse energy of 0.5 mJ, a pulse length of 100 ns, and a pulse repetition rate of 10 kHz. A total number of pulses may be more than 100 pulses.

In a particular embodiment, an assistant gas flow may be used to help clean the debris generated in laser processing. A vision system may be used as a sensor in determining when to switch the laser parameters. The vision system may detect the brightness and spectral information of flames to indicate whether the material being processed is a metal or a plastic.

One benefit of using different sets of laser parameters according to the embodiment of the invention is to process an entire workpiece with more than one pass, but without any time delay between two consecutive passes, as the time required for adjusting laser parameters is shorter than the time between consecutive laser pulses. This technique may require substantially less processing time than the case where at least two different lasers are required in processing a multilayer structure. When using at least two different lasers, it is difficult and time-consuming to re-achieve the alignment on each of the areas for successive laser drilling or cleaning, where each such area has been processed in a previous pass or previous passes.

In another embodiment of the present invention, processing can take place in a single pass over the workpiece rather than in multiple passes, which can occur if more than one laser is used. In single pass embodiment, a benefit is that throughput is maximized in comparison with conventional processing since the time taken to move the workpiece being processed (e.g., a printed circuit board) to various positions is usually greater than the time taken to process the workpiece (e.g., drilling a set of vias). Hence, having a single pass can reduce the total processing time. Thus, this embodiment can provide significant benefits in throughput by using the flexible laser systems described throughout the present specification.

Furthermore, the technique of using different sets of laser parameters is also better than using a single set of parameters to process different materials. When a single set of parameters is used in processing a workpiece having different materials, the parameters may not be optimized for any of the materials so that laser processing may take longer time or may result in undesirable side effects, such as pitting, ridging, or burn zone etc.

Utilizing embodiments of the present invention, it is possible to injection lock a pulsed semiconductor laser. Additionally, embodiments of the present invention enable amplification of stabilized pulses produced by the injection locked semiconductor laser using a fiber amplifier. According to embodiments of the present invention, the fiber amplifier provides a number of benefits including high gain, low cost, convenient fiber coupling of the pump laser, and the like. The tunable pulsed source provides benefits including the shaping of the laser pulses, various repetition rates, and the like. It should be noted that embodiments of the present invention enable the repetition rate to be varied with minimal adverse effects since injection locking is utilized to maintain the output wavelength at a predetermined value.

Figure 14:
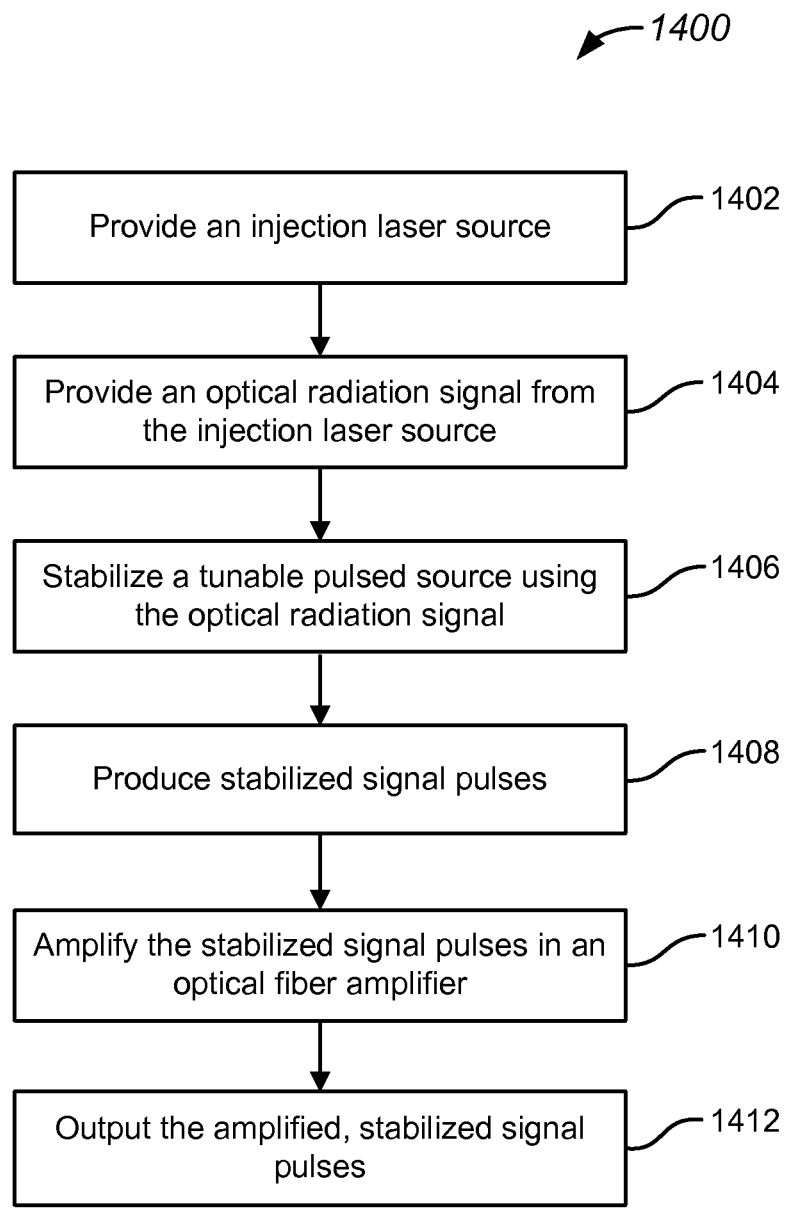
FIG. 14 is a simplified flowchart illustrating a method of providing amplified and stabilized laser pulses according to an embodiment of the present invention.

FIG. 14 is a simplified flowchart illustrating a method of providing amplified and stabilized laser pulses according to an embodiment of the present invention. The method 1400 includes providing an injection laser source (1410) and providing an optical radiation signal from the injection laser source (1412). The method also includes stabilizing a tunable pulsed source based on the optical radiation signal (1406) to produce stabilized signal pulses (1408). The method further includes amplifying the stabilized signal pulses in an optical fiber amplifier (1410) and outputting the amplified, stabilized signal pulses (1412). In an embodiment, the optical fiber amplifier includes a pump source optically coupled to an optically active fiber. As an example, the injection laser source can include a continuous wave semiconductor laser and the tunable pulsed can include a pulsed semiconductor laser. Utilizing embodiments of the present invention, a peak power of the amplified and stabilized signal pulses can be greater than 1 kW.

While the present invention has been described with respect to particular embodiments and specific examples thereof, it should be understood that other embodiments may fall within the spirit and scope of the invention. The scope of the invention should, therefore, be determined with reference to the appended claims along with their full scope of equivalents.

What is claimed is:

1. A method for providing a plurality of signal pulses, the method comprising:

providing a stabilizing optical radiation signal characterized by a first center wavelength, a first spectral linewidth, and an ooutput power;

coupling the optical radiation signal into a first port of an optical combiner;

transmitting the optical radiation signal from the first port to a second port of the optical combiner;

coupling the optical radiation signal from the second port into a tunable pulsed laser source comprising a semiconductor laser;

driving the tunable pulsed laser with drive signal to produce a plurality of signal pulses having temporal pulse shape, and including applying the drive signal to the semiconductor laser to adjust the temporal pulse shape in real time from pulse to pulse;

injection locking the laser to stabilize the spectral linewidth of the plurality of signal pulses;

coupling the plurality of signal pulses into the second port;

transmitting the plurality of signal pulses from the second port to a third port of the optical combiner; and outputting the plurality of signal pulses from the third port;

coupling the plurality of signal pulses into an input end of an optical amplifier;

amplifying the plurality of signal pulses; and outputting the plurality of amplified signal pulses at an output end of the optical amplifier.

2. The method of claim 1 wherein said amplifying includes using an optical amplifier comprising a pump source optically coupled to an optically active fiber.

3. The method of claim 1 where a peak power of pulses in the plurality of amplified, signal pulses is greater than 1 kW.

4. The method of claim 1, including changing the drive signal between consecutive optical pulses in the plurality of optical pulses.

5. The method of claim 1, including applying control signal to change the first center wavelength of the optical radiation signal.

6. The method of claim 1, including producing a feedback signal, and changing the drive signal in response to the feedback signal.

7. A laser system comprising:
   an injection laser source having an output and operable to provide a laser output characterized by a first wavelength, a first linewigth, an output power;
   a tunable pulsed source, comprising a semiconductor laser, characterized by gain bandwidth, the tunable source being operable to provide an output signal having an average power, the output signal comprising a plurality of optical pulses, each of the plurality of optical pulses being characterized by second wavelength, a second linewidth, and a peak power; and
   an optical combiner having a first port couples to the output of the injection laser source, a second port coupled to the tunable pulsed source from which the tunable pulsed source receives the laser output of the injection laser source, and a third port; and
   a controller connected with the tunable pulsed source which applies drive signal to the semiconductor laser to control temporal pulse shape of pulses in the plurality of optical pulses, and is configured to change the drive signal to the semiconductor laser to adjust the temporal pulse shapes in the plurality of optical pulses in real time, and wherein the second linewidth is stabilized by laser output of the injection laser source.

8. The laser system of claim 7 wherein the optical combiner comprises a three-port optical circulator.

9. The laser system of claim 7 wherein the injection laser source comprises a continuous wave semiconductor laser.

10. The laser system of claim 9 wherein the continuous wave semiconductor laser comprises a fiber Bragg grating stabilized semiconductor laser.

11. The laser system of claim 7 wherein the injection laser source comprises a pulsed semiconductor laser having a pulse width substantially longer than a pulse width of each of plurality of optical pulses.

12. The laser system of claim 7 wherein a front facet reflectivity of the semiconductor laser is less than 1%.

13. The laser system of claim 12 wherein the front facet reflectivity is less than 0.01%.

14. The laser system of claim 7 wherein the first center wavelength is within the gain bandwidth.

15. The laser system of claim 7 wherein the second spectral linewidth is approximately equal to the first linewidth.

16. The laser system of claim 7 wherein the second center wavelength is approximately equal to the first wavelength.

17. The laser system of claim 7 wherein the optical amplifier comprises an optically active fiber and a pump source optically coupled to the optically active fiber.

18. The laser of claim 7, wherein the controller is configured to change the drive signal between consecutive optical pulses in the plurality of optical pulses.

19. The laser system of claim 7, wherein the controller is connected with the injection laser source, and configured apply control signal to change the first wavelength of the laser output.

20. The laser system of claim 7, including a detector producing a feedback signal, and wherein the controller is configured to change the drive signal in response to the feedback signal.

* * * * *